United States Patent
Fujino et al.

(10) Patent No.: US 10,205,119 B2
(45) Date of Patent: Feb. 12, 2019

(54) LASER PACKAGING METHOD AND MANUFACTURING METHOD OF DISPLAY PANEL

(71) Applicant: BOE TECHNOLOGY GROUP CO., LTD., Beijing (CN)

(72) Inventors: Seiji Fujino, Beijing (CN); Wei Cui, Beijing (CN); Xiaohu Wang, Beijing (CN); Rui Hong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/768,944

(22) PCT Filed: Nov. 12, 2014

(86) PCT No.: PCT/CN2014/090870
§ 371 (c)(1),
(2) Date: Aug. 19, 2015

(87) PCT Pub. No.: WO2016/008238
PCT Pub. Date: Jan. 21, 2016

(65) Prior Publication Data
US 2016/0276622 A1    Sep. 22, 2016

(30) Foreign Application Priority Data

Jul. 17, 2014  (CN) .......................... 2014 1 0341820

(51) Int. Cl.
*H01L 51/52*    (2006.01)
*H01L 51/56*    (2006.01)
(Continued)

(52) U.S. Cl.
CPC ............ *H01L 51/5246* (2013.01); *C03C 8/24* (2013.01); *H01L 51/0024* (2013.01); *H01L 51/56* (2013.01); *H01L 2251/566* (2013.01)

(58) Field of Classification Search
CPC . H01L 51/56; H01L 51/0024; H01L 51/5246; H01L 2251/566; C03C 8/24
See application file for complete search history.

(56) References Cited

U.S. PATENT DOCUMENTS 6,342,941 B1 *  1/2002  Nei ..................... G03F 7/70433
                                                     355/52
6,650,394 B1 * 11/2003  Kim ..................... G02F 1/1333
                                                     349/158
(Continued)

FOREIGN PATENT DOCUMENTS

CN    101533790 A    9/2009
CN    101877387 A   11/2010
(Continued)

OTHER PUBLICATIONS

International Search Report of PCT/CN2014/090870 in Chinese, dated Apr. 22, 2015 with English translation.
(Continued)

*Primary Examiner* — Savitr Mulpuri
(74) *Attorney, Agent, or Firm* — Collard & Roe, P.C.

(57) ABSTRACT

A laser packaging method and a manufacturing method of a display panel are provided. The laser packaging method includes placing a first substrate (2) on a platform (1), and arranging a glass frit in a packaging region of the first substrate (2); cell-assembling a second substrate (3) and the first substrate (2); and pre-heating the first substrate (2) and the second substrate (3) which are cell-assembled.

8 Claims, 2 Drawing Sheets

(51) Int. Cl.
  *H01L 51/00* (2006.01)
  *C03C 8/24* (2006.01)

(56) References Cited

U.S. PATENT DOCUMENTS

| | | | |
|---|---|---|---|
| 7,838,314 B2* | 11/2010 | Choi | H01L 51/524 |
| | | | 257/E21.259 |
| 8,070,546 B2 | 12/2011 | Joo et al. | |
| 8,175,124 B2 | 5/2012 | Lee et al. | |
| 2004/0004691 A1* | 1/2004 | Nakahara | G02F 1/1333 |
| | | | 349/158 |
| 2008/0314626 A1* | 12/2008 | Moore | G06F 3/0412 |
| | | | 174/255 |
| 2012/0251800 A1* | 10/2012 | Nakayama | G06F 3/044 |
| | | | 428/210 |
| 2016/0359131 A1* | 12/2016 | Gao | H01L 51/5246 |
| 2017/0090280 A1* | 3/2017 | Fujino | G03F 1/76 |

FOREIGN PATENT DOCUMENTS

| | | |
|---|---|---|
| CN | 103064209 A | 4/2013 |
| CN | 103085106 A | 5/2013 |
| CN | 103178214 A | 6/2013 |
| KR | 10-2013-0078811 A | 7/2013 |

OTHER PUBLICATIONS

Notice of Transmittal of the International Search Report of PCT/CN2014/090870 in Chinese, dated Apr. 22, 2015.
Written Opinion of the International Searching Authority of PCT/CN2014/090870 in Chinese, dated Apr. 22, 2015 with English translation.
Chinese Office Action in Chinese Application No. 201410341820.7, dated Jan. 26, 2016 with English translation.

* cited by examiner

LASER PACKAGING METHOD AND MANUFACTURING METHOD OF DISPLAY PANEL

CROSS REFERENCE TO RELATED APPLICATIONS

This application is the National Stage of PCT/CN2014/090870 filed on Nov. 12, 2014, which claims priority under 35 U.S.C. § 119 of Chinese Application No. 201410341820.7 filed on Jul. 17, 2014, the disclosure of which is incorporated by reference.

TECHNICAL FIELD

Embodiments of the present disclosure relate to a laser packaging method, a manufacturing method of a display panel.

BACKGROUND

As a new type of panel display, an organic light-emitting diode (OLED) device attracts more and more attention, and becomes a next generation of display technology which may replace the liquid crystal display, due to characteristics such as active light-emitting, high brightness, wide viewing angle, fast response, low energy consumption and flexibility and so on.

In current OLED devices, there is an organic layer material, which is extremely sensitive to water vapor and oxygen, so that service lives of the OLED devices are greatly reduced. In order to solve this problem, in the prior art, it is mainly to use a variety of materials to isolate the organic layer material of OLED from outside world, to make the sealing meet: an amount of water vapor is less than $10^{-6}$ $g/m^2/day$, and an amount of oxygen is less than $10^{-3}$ $cm^3/m^2/day$. The main sealing method is that: in an atmosphere of nitrogen, a first substrate of an OLED panel is placed on a platform, and a glass frit is filled in a sealing region of the first substrate, a second substrate is cell-assembled with the first substrate, and then the glass frit is heated by moving laser beam, to melt the glass frit, and finally a sealed packaging connection is formed by the melted glass frit between the first substrate and the second substrate.

An inventor finds that there are at least problems in the prior art as follows: base substrates of the first substrate and the second substrate are both glass base substrates, and laser emitted from laser beam has very high temperature (usually between 350° C. and 500° C.), so a temperature difference between the glass base substrate and the laser beam is very large, at this moment, if the laser beam hits the glass base substrate, the glass base substrate will be easily ruptured, which affects a packaging effect.

SUMMARY

According to one embodiment of the present disclosure, there is provided a laser packaging method, comprising:
 placing a first substrate on a platform, and arranging a glass frit in a packaging region of the first substrate;
 cell-assembling a second substrate and the first substrate;
 pre-heating the first substrate and the second substrate which are cell-assembled.
In one example, the platform is a heating platform, and pre-heating the first substrate and the second substrate which are cell-assembled includes:
 pre-heating the first substrate and the second substrate which are cell-assembled by the heating platform.
In one example, the heating platform is a heating platform of warm water circulating type.
In one example, a heating temperature for pre-heating the first substrate and the second substrate which are cell-assembled is between 25° C. and 150° C.
In one example, after pre-heating the first substrate and the second substrate which are cell-assembled, the method further comprises:
 irradiating the packaging region by laser, to melt the glass frit to form a packaging glass, and seal a region surrounded by the packaging region of the first substrate.
In one example, both the first substrate and the second substrate include a glass base substrate.
In one example, an organic light-emitting diode (OLED) device is formed on a surface side of one of the first substrate and the second substrate facing the other one.
In one example, the OLED device is formed in a region surrounded by the packaging region.

According to another embodiment of the present disclosure, there is provided a manufacturing method of a display panel, comprising a step of sealing a first substrate and a second substrate, which are cell-assembled, by any laser packaging method described above, to form a mother board of a display panel.
In one example, the manufacturing method of the display panel further comprises: exposing the mother board of the display panel by irradiating a mask with laser, to form a pre-cutting region;
 cutting the pre-cutting region, to form a display panel.
In one example, the mask is a heatable mask, and exposing the mother board of the display panel by irradiating the mask with laser to form the pre-cutting region includes:
 pre-heating the mask;
 exposing the mother board of the display panel by irradiating the preheated mask with laser, to form the pre-cutting region.
In one example, a heating temperature for pre-heating the mask is between 25° C. and 150° C.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
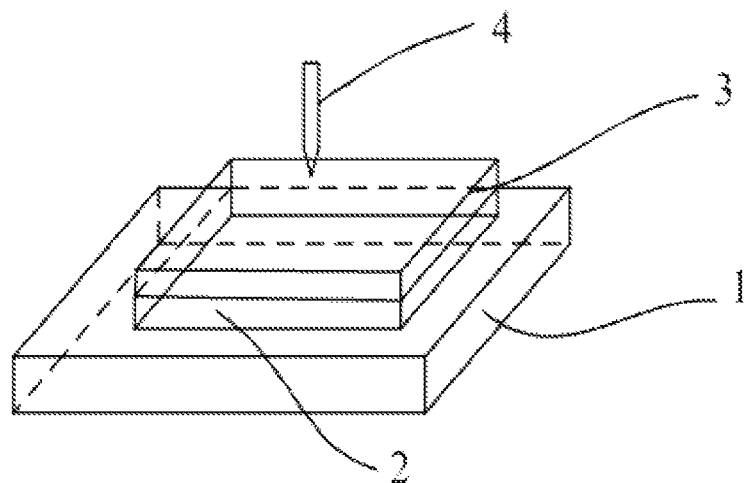
FIG. 1 is a schematic diagram of a laser packaging method according to some embodiments of the disclosure.
Figure 2:
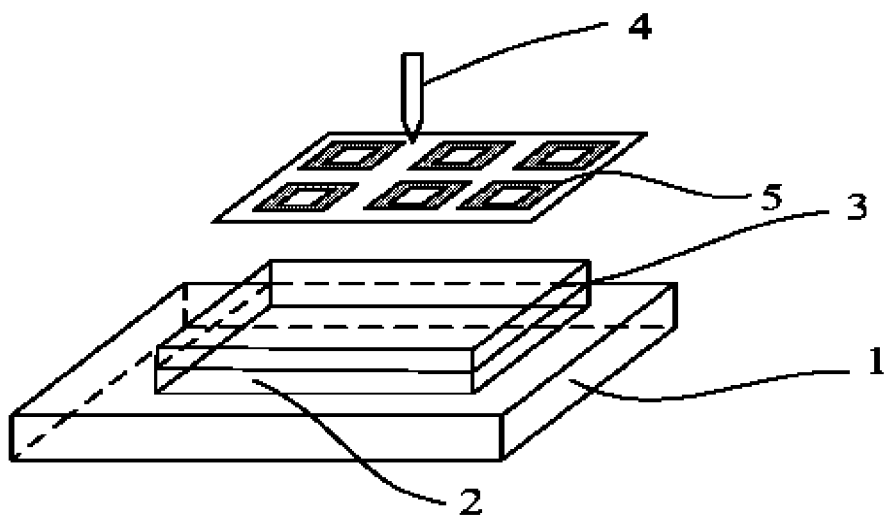
FIG. 2 is a schematic diagram of a manufacturing method of a display panel according to some embodiments of the disclosure.
Figure 3:
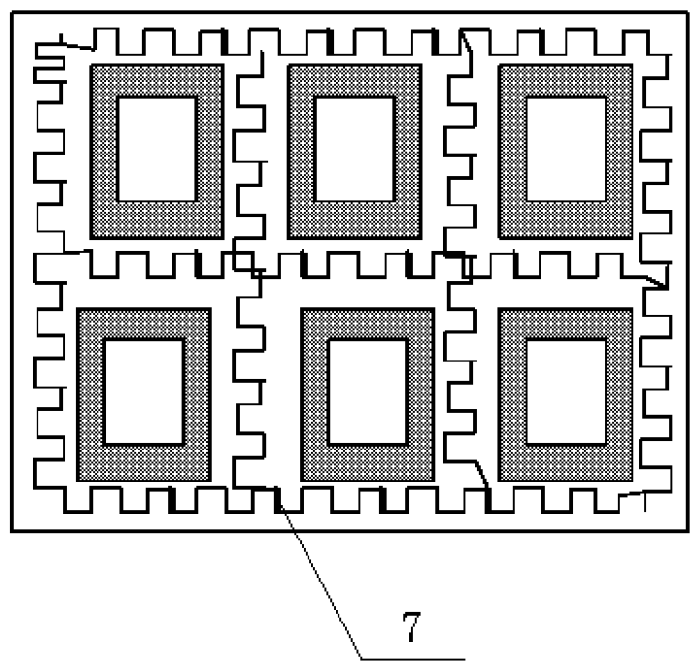
FIG. 3 is a schematic diagram of a mask used in the manufacturing method of the display panel according to some embodiments of the disclosure.

In conjunction with FIGS. 1 to 3, according to some embodiments of the present disclosure, there is provided a laser packaging method, comprising the following steps.

Step 1: placing a first substrate 2 on a platform 1, and arranging a glass frit in a packaging region of the first substrate 2. The glass frit may be arranged in the packaging region of the first substrate by depositing, filling, spraying and other manners, which is not limited here.

According to some embodiments of the present disclosure, there is no special limitation to materials of glass frit. For example, glass of low melting point may be selected. In some examples, a fusion temperature of glass frit is 350° C. to 550° C.

Step 2: cell-assembling a second substrate 3 and the first substrate 2.

Step 3: pre-heating the cell-assembled first substrate 2 and second substrate 3.

In these embodiments, the platform 1 is, for example, a heating platform, the cell-assembled first substrate 2 and second substrate 3 can be pre-heated by the heating platform. The heating platform is, for example, a heating platform of warm water circulating type, but the heating manner is not limited thereto.

For example, both the first substrate 2 and the second substrate 3 include a glass base substrate. An organic light-emitting diode (OLED) device (not illustrated) is formed on a surface side of one of the first substrate 2 and the second substrate 3 facing the other one. The OLED device is formed in a region surrounded by the packaging region.

According to some embodiments of the present disclosure, the glass base substrate can be made of alkali-free glass. For example, an example of a composition of a glass base substrate can be: $SiO_2$ (55-75%), $Al_2O_3$ (12-20%), $B_2O_3$ (0-1%), MgO (0-5%), CaO (2~15%), and BaO (1-15%) (these percentages are mass percentages). However, the glass base substrate according to the embodiment of the disclosure is not limited thereto.

It should be noted that, a purpose of pre-heating the first substrate 2 and the second substrate 3 on the platform 1 is to prevent that, upon the first substrate 2 and the second substrate 3 being sealed by irradiating laser in subsequent steps, the first substrate 2 and/or the second substrate 3 is ruptured due to the very large temperature difference between the first substrate 2 as well as the second substrate 3 and the irradiated laser 4. Specifically, materials of the base substrates of the first substrate 2 and the second substrate 3 are glass, so upon a temperature in contact with the glass is quite different from the temperature of the glass itself, the glass is very easy to rupture.

In these embodiments, the pre-heating temperature, for example, is between 25° C. and 150° C.; in some examples, the heating temperature, for example, is between 50° C. and 125° C.; in some examples, the heating temperature, for example, is between 75° C. and 100° C. Heating time is about few tens of seconds, and in some examples, the heating time is 20-90 seconds; in some examples, the heating time is 30-80 seconds; in some examples, the heating time is 40-70 seconds. For example, the heating time can be set according to a thickness of a base substrate. For example, the pre-heating temperature for a base substrate can also be determined according to the temperature of the irradiated laser 4.

Step 4: irradiating the packaging region by laser 4, to melt the glass frit to form a packaging glass, sealing a region surrounded by the packaging region of the first substrate 2.

Because in the packaging method according to these embodiments, before the cell-assembled first substrate 2 and second substrate 3 are irradiated by the laser 4, the first substrate 2 and the second substrate 3 are pre-heated at first, then a temperature difference between the first substrate 2 as well as the second substrate 3 and the laser 4 can be reduced, which can effectively prevent the first substrate 2 and the second substrate 3 from being ruptured when the laser 4 is adopted for packaging.

In conjunction with FIGS. 1 to 3, according to some embodiments of the present disclosure, there is provided a manufacturing method of a display panel, which comprises a step of sealing the cell-assembled first substrate 2 and second substrate 3 by the laser packaging method in the above embodiment, to form a mother board of a display panel.

The manufacturing method of the display panel in these embodiments comprises:

Step 1: sealing the cell-assembled first substrate 2 and second substrate 3 by the laser packaging method in the above embodiment, to form a mother board of a display panel.

Step 2: exposing the mother board of the display panel by irradiating a mask 5 with laser 4, to form a pre-cutting region.

The mask 5, for example, may be a heatable mask 5, generally the mask 5 is made of glass, and the heatable mask 5 can be realized by arranging heating wires 7 in the glass.

For example, exposing the mother board of the display panel by irradiating a mask 5 with laser 4 to form the pre-cutting region includes:

pre-heating the mask 5; the pre-heating temperature, for example, is between 25° C. and 150° C.; in some examples, the heating temperature is, for example, between 50° C. and 125° C.; in some examples, the heating temperature is, for example, between 75° C. and 100° C. For example, the temperature of the mask 5 can be set according to the temperature of the laser 4.

Exposing the mother board of the display panel by irradiating the preheated mask 5 with the laser 4, to form the pre-cutting region.

Step 3: cutting the pre-cutting region, to form a display panel.

In these embodiments, since the mask 5 is a heatable mask 5, upon the laser 4 irradiating the mask 5, a temperature difference between the mask 5 and the laser 4 is reduced, which can avoid rupture of the mask 5 made of glass material to affect cutting the mother board of the display panel.

The foregoing embodiments merely are exemplary embodiments of the disclosure, and not intended to define the scope of the disclosure, and the scope of the disclosure is determined by the appended claims.

The present application claims priority of Chinese Patent Application No. 201410341820.7 filed on Jul. 17, 2014, the disclosure of which is incorporated herein by reference in its entirety as part of the present application.

The invention claimed is:

1. A manufacturing method of a display panel, comprising:
   sealing a first substrate and a second substrate, which are cell-assembled, by a laser packaging method, so as to form a mother board of a display panel;

exposing the mother board of the display panel by irradiating a mask with laser, to form a pre-cutting region; and cutting the pre-cutting region, to form a display panel, wherein, the mask is a heatable mask, and exposing the mother board of the display panel by irradiating the mask with laser to form the pre-cutting region includes:

pre-heating the mask; and exposing the mother board of the display panel by irradiating the preheated mask with laser, to form the pre-cutting region, wherein, the mask is made of glass in which heating wires are arranged, and preheating the mask is performed by using the heating wires, and wherein, the heating wires surround a part of the mask corresponding to the pre-cutting region; and wherein, the laser packaging method comprises:

placing the first substrate on a platform, and arranging a glass frit in a packaging region of the first substrate;

cell-assembling the second substrate and the first substrate; and pre-heating the first substrate and the second substrate which are cell-assembled;

wherein, an organic light-emitting diode (OLED) device is formed on a surface side of one of the first substrate and the second substrate facing the other one.

2. The manufacturing method of the display panel according to claim 1, wherein, a heating temperature for pre-heating the mask is between 25° C. and 150° C.

3. The manufacturing method of the display panel according to claim 1 wherein, the platform is a heating platform, and pre-heating the first substrate and the second substrate which are cell-assembled includes:

pre-heating the first substrate and the second substrate which are cell-assembled by the heating platform.

4. The manufacturing method of the display panel according to claim 1, wherein, the heating platform is a heating platform of warm water circulating type.

5. The manufacturing method of the display panel according to claim 1, wherein, a heating temperature for pre-heating the first substrate and the second substrate which are cell-assembled is between 25° C. and 150° C.

6. The manufacturing method of the display panel according to claim 1, wherein, after pre-heating the first substrate and the second substrate which are cell-assembled, the method further comprises:

irradiating the packaging region by laser, to melt the glass frit to form a packaging glass, and seal a region surrounded by the packaging region of the first substrate.

7. The manufacturing method of the display panel according to claim 1, wherein, both the first substrate and the second substrate include a glass base substrate.

8. The manufacturing method of the display panel according to claim 1, wherein, the OLED device is formed in a region surrounded by the packaging region.

* * * * *